United States Patent
Wu (10) Patent No.: US 12,445,093 B2
(45) Date of Patent: Oct. 14, 2025

(54) SWITCHED CAPACITOR AMPLIFYING APPARATUS AND METHOD HAVING GAIN ADJUSTMENT MECHANISM

(71) Applicant: REALTEK SEMICONDUCTOR CORPORATION, Hsinchu (TW)

(72) Inventor: Yen-Ting Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 672 days.

(21) Appl. No.: 17/737,051

(22) Filed: May 5, 2022

(65) Prior Publication Data

US 2022/0407475 A1    Dec. 22, 2022

(30) Foreign Application Priority Data

Jun. 21, 2021 (TW) ................. 110122616

(51) Int. Cl.
*H03F 3/00* (2006.01)
*H03H 19/00* (2006.01)
*H03K 19/0175* (2006.01)

(52) U.S. Cl.
CPC ............ *H03F 3/005* (2013.01); *H03H 19/004* (2013.01); *H03K 19/017509* (2013.01); *H03F 2200/297* (2013.01); *H03F 2200/378* (2013.01)

(58) Field of Classification Search
CPC ...... H03F 3/005; H03F 3/45; H03F 2200/378; H03F 2203/45156; H03F 2200/297; H03K 19/017509; H03H 19/004

(Continued)

(56) References Cited

U.S. PATENT DOCUMENTS

| 7,692,471 B2 * | 4/2010 | Uno .................... H03F 3/4565 |
| | | 327/337 |
| 2015/0255173 A1 * | 9/2015 | Tokunaga .............. H03F 3/005 |
| | | 341/172 |
| 2016/0329881 A1 * | 11/2016 | Matsuno ................. H03F 3/24 |

FOREIGN PATENT DOCUMENTS

| KR | 20210041358 A | * | 4/2021 | ......... H03H 11/1252 |
| TW | 201312934 A | * | 3/2013 | ......... H03F 3/45475 |
| TW | I638529 B | * | 10/2018 | |

OTHER PUBLICATIONS

Musah et al., Correlated level shifting technique with cross-coupled gain-enhancement capacitors, 2009, IEEE (Year: 2009).*

(Continued)

*Primary Examiner* — Andrea Lindgren Baltzell
*Assistant Examiner* — Lance Torbjorn Bartol
(74) *Attorney, Agent, or Firm* — WPAT, PC (57) ABSTRACT

The present invention discloses a switched capacitor amplifying apparatus having gain adjustment mechanism. An amplifier includes an input terminal and an output terminal. A capacitor circuit includes a sampling capacitor circuit, a load capacitor and a level-shifting capacitor array. The sampling capacitor circuit includes two sampling input terminals and a sampling output terminal to receive an input signal from a signal input terminal and output a sampled result to the input terminal of the amplifier. The load capacitor and the level-shifting capacitor array are charged according to the output terminal of the amplifier and the load capacitor is subsequently charged by the level-shifting capacitor array to accomplish level-shifting such that the load capacitor generates an output signal through a signal output terminal. A control circuit determines an enabling combination of level-shifting capacitors included in the level-shifting capacitor array to determine an equivalent capacitance, to further determine a loop gain.

12 Claims, 6 Drawing Sheets

(58) Field of Classification Search
USPC .......................................................... 330/108
See application file for complete search history.

(56) References Cited

OTHER PUBLICATIONS

Jinfeng et al., A reconfigurable multirate single-bit sigma delta modulator for multi-standard wireless radio receivers, 2011, IEEE, 3rd International Conference on Communication Software and Networks (Year: 2011).*

Gregoire et al., An Over-60 dB True Rail-to-Rail Performance Using Correlated Level Shifting and an Opamp With Only 30 dB Loop Gain, 2008, IEEE (Year: 2008).*

B. Robert Gregoire et al., An Over-60 dB True Rail-to-Rail Performance Using Correlated Level Shifting and an Opamp With Only 30 dB Loop Gain, IEEE Journal of Solid-State Circuits, vol. 43, No. 12, Dec. 2008.

T. Musah and U.-K. Moon, Correlated level shifting technique with cross-coupled gain-enhancement capacitors, Electronics Letters Jun. 18, 2009 vol. 45 No. 13.

* cited by examiner

SWITCHED CAPACITOR AMPLIFYING APPARATUS AND METHOD HAVING GAIN ADJUSTMENT MECHANISM

BACKGROUND OF THE INVENTION

1. Field of the Invention

The present invention relates to a switched capacitor amplifying apparatus and a switched capacitor amplifying method having gain adjustment mechanism.

2. Description of Related Art

In analog signal processing circuits, a gain stage circuit is required to amplify the input analog signal. In some approaches, a switched capacitor amplifying circuit is often used to implement the gain stage circuit.

A switched capacitor amplifying circuit needs to include an operational amplifier and a group of capacitors to amplify the input signal. However, a DC (direct current) gain of the operational amplifier is difficult to be kept stable due to environmental issues. Once the DC gain varies, the loop gain between the output signal and the input signal is simultaneously affected.

SUMMARY OF THE INVENTION

In consideration of the problem of the prior art, an object of the present invention is to supply a switched capacitor amplifying apparatus and a switched capacitor amplifying method having gain adjustment mechanism.

The present invention discloses a switched capacitor amplifying apparatus having gain adjustment mechanism that includes an amplifier, a capacitor circuit and a control circuit. The amplifier includes an input terminal and an output terminal The capacitor circuit corresponds to a signal input terminal and a signal output terminal and includes a sampling capacitor circuit, a load capacitor and a level-shifting capacitor array. The sampling capacitor circuit includes two sampling input terminals and a sampling output terminal, wherein the two sampling input terminals receive and sample an input signal from the signal input terminal to further output a sampled result to the input terminal of the amplifier through the sampling output terminal The level-shifting capacitor array includes a plurality of level-shifting capacitors. The load capacitor and the level-shifting capacitor array generate a plurality of connection relations with the output terminal of the amplifier, such that the load capacitor and the level-shifting capacitor array are respectively charged according to an output from the output terminal of the amplifier, and the load capacitor is subsequently charged by the level-shifting capacitor array to accomplish level-shifting such that the load capacitor generates an output signal through the signal output terminal. The control circuit determines an enabling combination of the level-shifting capacitors to determine an equivalent capacitance of the level-shifting capacitor array, to further determine a loop gain between the output signal and the input signal.

The present invention also discloses a switched capacitor amplifying method having gain adjustment mechanism used in a switched capacitor amplifying apparatus that includes steps outlined below. An input signal is received and sampled from a signal input terminal by two sampling input terminals of a sampling capacitor circuit of a capacitor circuit to output a sampled result to an input terminal of an amplifier through a sampling output terminal. A plurality of connection relations are generated by a load capacitor and a level-shifting capacitor array including a plurality of level-shifting capacitors with the output terminal of the amplifier, such that the load capacitor and the level-shifting capacitor array are respectively charged according to an output from an output terminal of the amplifier, and the load capacitor is subsequently charged by the level-shifting capacitor array to accomplish level-shifting such that the load capacitor generates an output signal through the signal output terminal. An enabling combination of the level-shifting capacitors is determined by a control circuit to determine an equivalent capacitance of the level-shifting capacitor array, so as to further determine a loop gain between the output signal and the input signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a switched capacitor amplifying apparatus and a switched capacitor amplifying method having gain adjustment mechanism to dispose a level-shifting capacitor array under the control of a control circuit such that an equivalent capacitance of a level-shifting capacitor array is adjusted according to a variation of the DC gain of an amplifier to compensate a loop gain of an amplifier.

Figure 1:
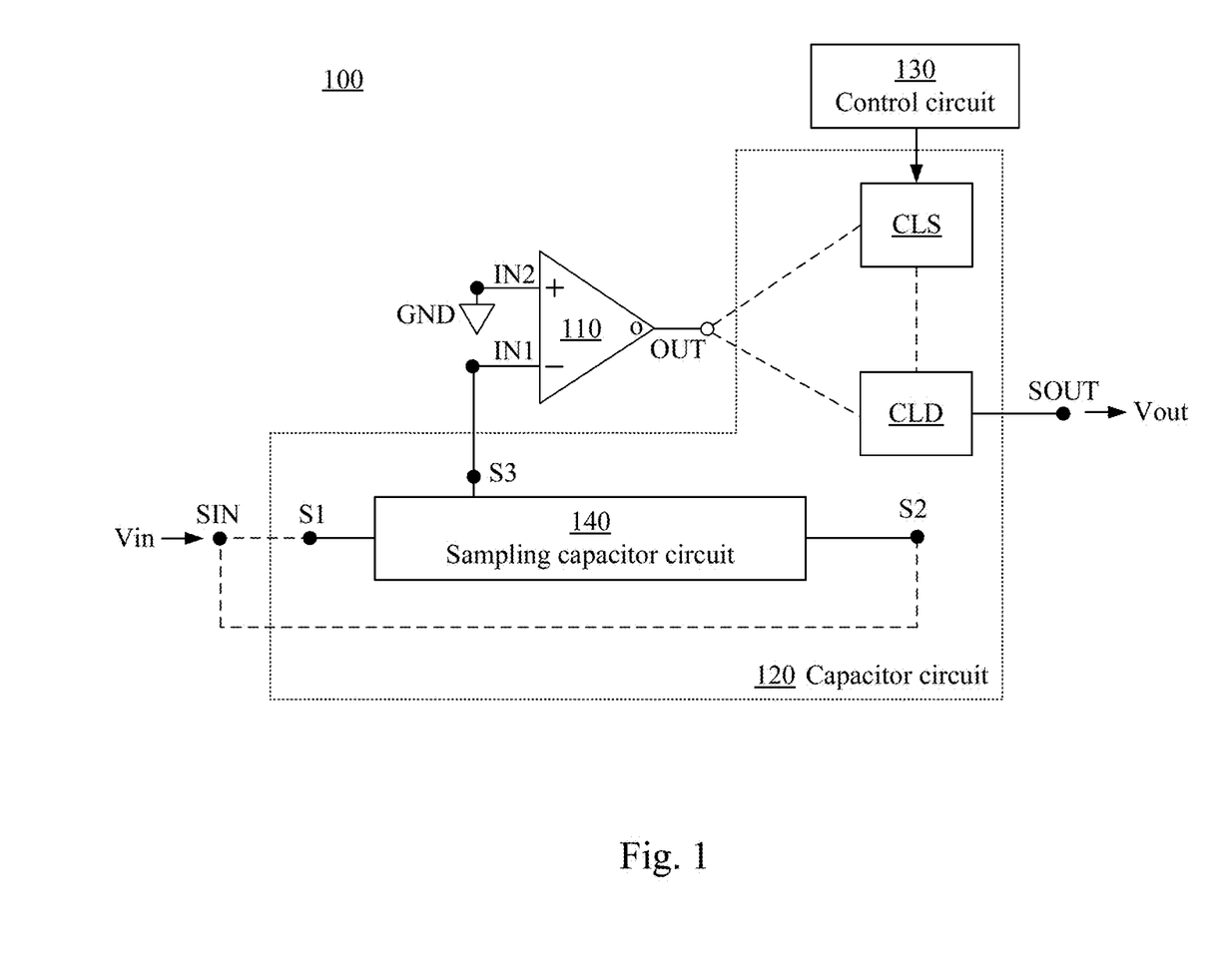
FIG. 1 illustrates a block diagram of a switched capacitor amplifying apparatus having gain adjustment mechanism according to an embodiment of the present invention.

Reference is now made to FIG. 1. FIG. 1 illustrates a block diagram of a switched capacitor amplifying apparatus 100 having gain adjustment mechanism according to an embodiment of the present invention. The switched capacitor amplifying apparatus 100 includes an amplifier 110, a capacitor circuit 120 and a control circuit 130.

In an embodiment, the amplifier 110 is an operational amplifier and includes an input terminal IN1 and an output terminal OUT. In an embodiment, the input terminal IN1 is an inverted input terminal, and is labeled by a symbol '-'. The output terminal OUT is labeled by a symbol 'o'. In an embodiment, the amplifier 110 further includes an input terminal IN2 that is a non-inverted input terminal and is labeled by a symbol '+'. The input terminal IN2 is electrically coupled to a ground terminal GND.

The capacitor circuit 120 corresponds to a signal input terminal SIN and a signal output terminal SOUT and includes a sampling capacitor circuit 140, a load capacitor CLD and a level-shifting capacitor array CLS.

The sampling capacitor circuit 140 includes a sampling input terminal S1, a sampling input terminal S2 and a sampling output terminal S3. The sampling capacitor circuit 140 is configured to receive and sample an input signal Vin from the sampling input terminal Si and the sampling input terminal S2 to further output a sampled result to the input terminal IN1 of the amplifier 110 through the sampling output terminal S3.

The level-shifting capacitor array CLS includes a plurality of level-shifting capacitors (not illustrated in FIG. 1). A part of the level-shifting capacitors are enabled and the other part of the level-shifting capacitors are disabled. According to different enabling combinations of the level-shifting capacitors, the level-shifting capacitor array CLS has different equivalent capacitances.

The load capacitor CLD and the level-shifting capacitor array CLS generate a plurality of connection relations with the output terminal OUT of the amplifier 110. In FIG. 1, only dashed lines are used to indicate that these three elements can be coupled with different connection relations without illustrating any actual connection relation. According to different connection relations, the load capacitor CLD and level-shifting capacitor array CLS are respectively charged according to an output from the output terminal OUT of the amplifier 110, and the load capacitor CLD is subsequently charged by the level-shifting capacitor array CLS to accomplish level-shifting such that the load capacitor CLD generates an output signal Vout through the signal output terminal SOUT.

The control circuit 130 determines the enabling combination of the level-shifting capacitors of the level-shifting capacitor array CLS described above to determine the equivalent capacitance of the level-shifting capacitor array CLS. The equivalent capacitance of the level-shifting capacitor array CLS affects the amount of electrical charges that can be charged to the level-shifting capacitor array CLS, affects the amount of electrical charges that the level-shifting capacitor array CLS can provide to the load capacitor CLD and further affects the level of the output signal Vout. As a result, the equivalent capacitance of the level-shifting capacitor array CLS determines a loop gain between the output signal Vout and the input signal Vin.

Figure 2A:
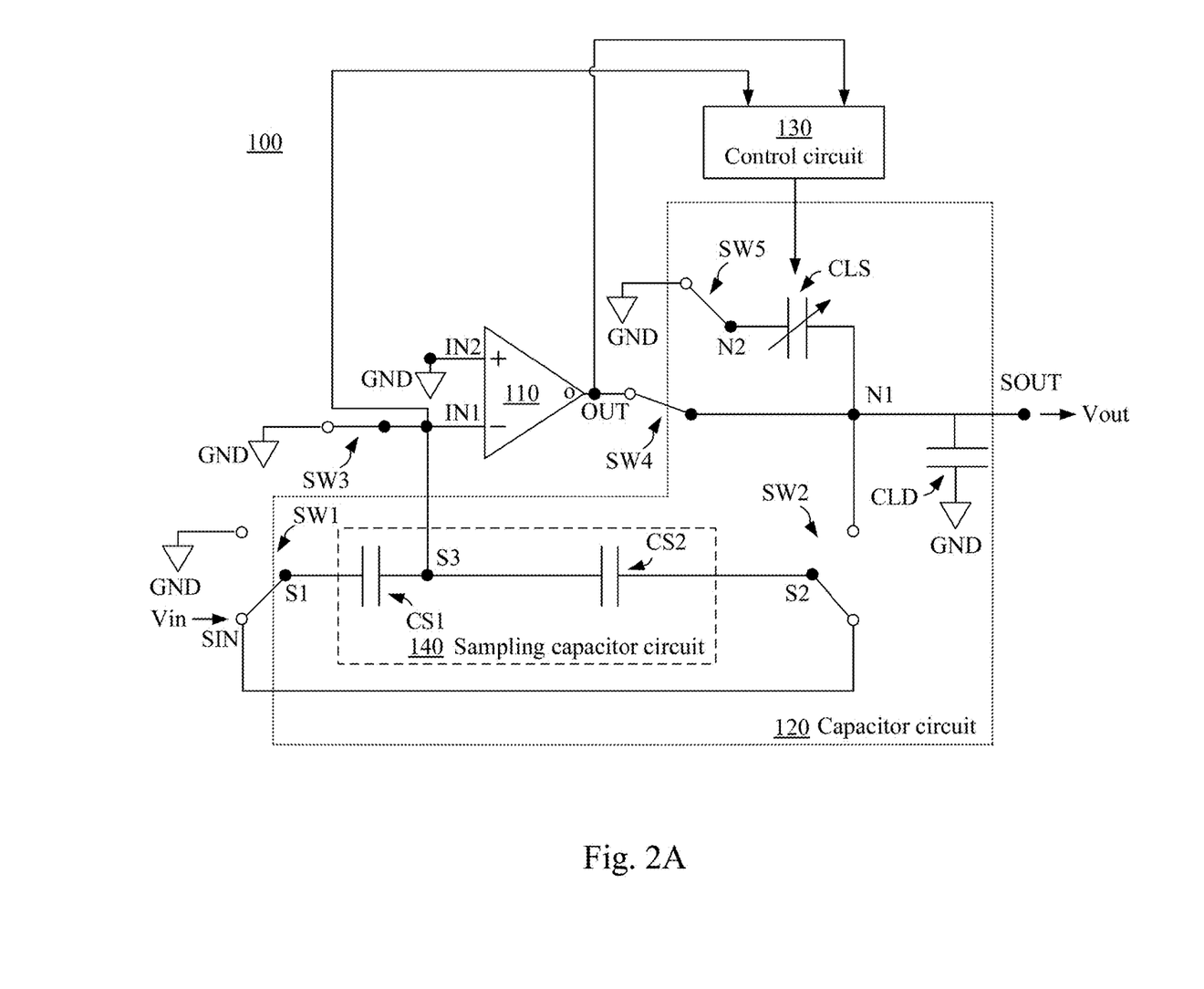
FIGS. 2A-2C illustrate detailed circuit diagrams of the switched capacitor amplifying apparatus in different operation periods according to an embodiment of the present invention.
Figure 2B:
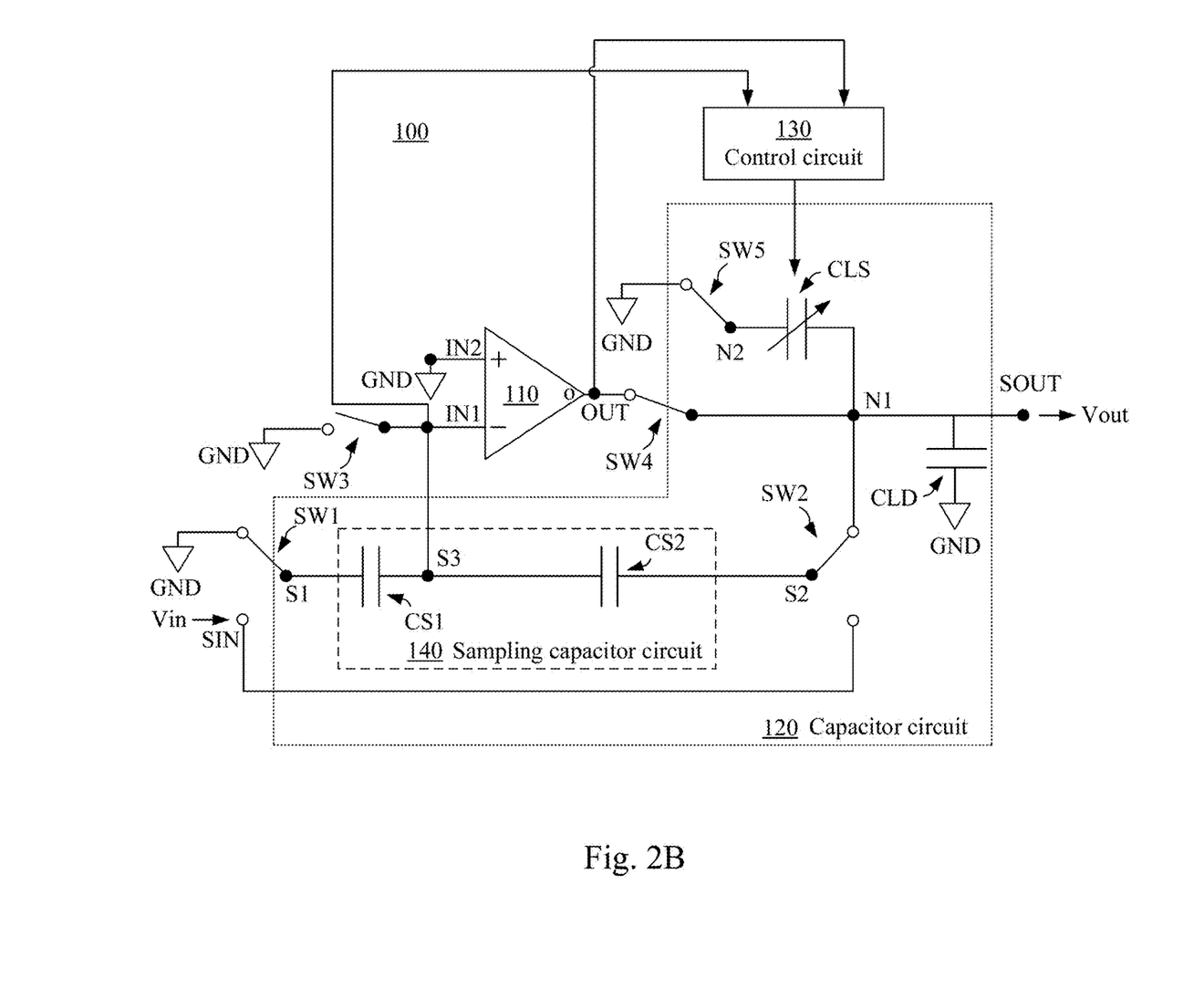
Figure 2C:
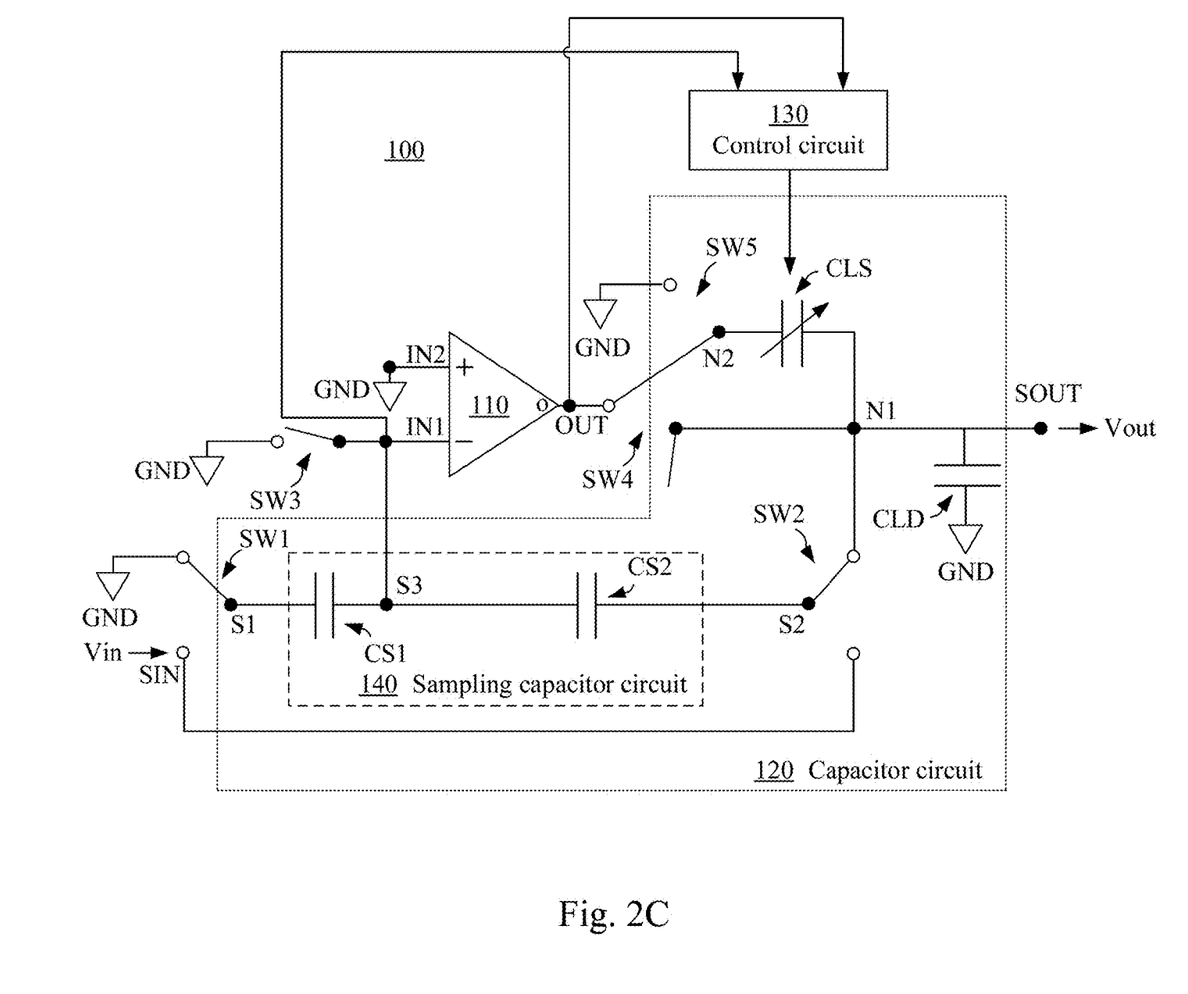

Reference is now made to FIGS. 2A-2C. FIGS. 2A-2C illustrate detailed circuit diagrams of the switched capacitor amplifying apparatus 100 in different operation periods according to an embodiment of the present invention. The configuration and operation of the switched capacitor amplifying apparatus 100 is further described in detail in accompany with FIGS. 2A-2C.

As illustrated in FIG. 2A, the sampling capacitor circuit 140 actually includes a first sampling capacitor CS1 and a second sampling capacitor CS2. The first sampling capacitor CS1 is electrically coupled between the sampling input terminal S1 and the sampling output terminal S3. The second sampling capacitor CS2 is electrically coupled between the sampling input terminal S2 and the sampling output terminal S3.

The load capacitor CLD is electrically coupled between the first connection terminal N1 and the ground terminal GND. In FIGS. 2A-2C, the load capacitor CLD is illustrated as one capacitor. The first connection terminal N1 is further electrically coupled to the signal output terminal SOUT. The level-shifting capacitor array CLS is electrically coupled between the first connection terminal N1 and the second connection terminal N2. In FIGS. 2A-2C, the level-shifting capacitor array CLS is illustrated as a variable capacitor.

In the present embodiment, the switched capacitor amplifying apparatus 100 includes a first switching unit SW1, a second switching unit SW2, a third switching unit SW3, a fourth switching unit SW4 and fifth switching unit SW5.

The first switching unit SW1 includes a first terminal electrically coupled to the sampling input terminal S1 and a second terminal switched to be electrically coupled to the signal input terminal SIN or the ground terminal GND. The second switching unit SW2 includes a first terminal electrically coupled to the sampling input terminal S2 and a second terminal switched to be electrically coupled to the signal input terminal SIN or the first connection terminal N1. The third switching unit SW3 includes a first terminal electrically coupled to the sampling output terminal S3 and the input terminal IN1 of the amplifier 110 and a second terminal switched to be electrically coupled to ground terminal GND or to be electrically isolated from the ground terminal GND.

The fourth switching unit SW4 includes a first terminal electrically coupled to the first connection terminal N1 and a second terminal switched to be electrically coupled to the output terminal OUT of the amplifier 110 or to be electrically isolated from the output terminal OUT of the amplifier 110. The fifth switching unit SW5 includes a first terminal electrically coupled to the second connection terminal N2 and a second terminal switched to be electrically coupled to the ground terminal GND or the output terminal OUT of the amplifier 110.

The switched capacitor amplifying apparatus 100 can switch the first switching unit SW1 to the fifth switching unit SW5 to generate different configurations in different operation periods so as to receive the input signal Vin and generate the amplified output signal Vout. In an embodiment, the switched capacitor amplifying apparatus 100 operates in a sampling period, an estimation period and a level shifting period in series.

As illustrated in FIG. 2A, in the sampling period, the first switching unit SW1 makes the sampling input terminal S1 electrically coupled to the signal input terminal SIN, and the second switching unit SW2 makes the sampling input terminal S2 electrically coupled to the signal input terminal SIN. The third switching unit SW3 makes the sampling output terminal S3 and the input terminal IN1 of the amplifier 110 electrically coupled to the ground terminal GND. The fourth switching unit SW4 makes the first connection terminal NI electrically coupled to the output terminal OUT of the amplifier 110. The fifth switching unit SW5 makes the second connection terminal N2 electrically coupled to the ground terminal GND.

As a result, in the sampling period, the sampling capacitor circuit 140 receives the input signal Vin through the sampling input terminal Si and the sampling input terminal S2 and samples the input signal Vin.

As illustrated in FIG. 2B, in the estimation period, the first switching unit SW1 makes the sampling input terminal S1 electrically coupled to the ground terminal GND and the second switching unit SW2 makes the sampling input terminal S2 electrically coupled to the first connection terminal N1. The third switching unit SW3 makes the sampling output terminal S3 and the input terminal IN1 of the amplifier 110 electrically isolated from the ground terminal GND. The fourth switching unit SW4 makes the first connection terminal N1 electrically coupled to the output terminal OUT of the amplifier 110. The fifth switching unit SW5 makes the second connection terminal N2 electrically coupled to the ground terminal GND.

As a result, in the estimation period, the sampling capacitor circuit 140 output the sampled result of the input signal Vin through the sampling output terminal S3 to the input terminal IN1 of the amplifier 110. Further, the load capacitor CLD and level-shifting capacitor array CLS are charged according to the output from the output terminal OUT of the amplifier 110. Under such a condition, the load capacitor CLD makes the voltage of the signal output terminal SOUT increase.

As illustrated in FIG. 2C, in the level shifting period, the first switching unit SW1 makes the sampling input terminal S1 electrically coupled to the ground terminal GND and the second switching unit SW2 makes the sampling input terminal S2 electrically coupled to the first connection terminal N1. The third switching unit SW3 makes the sampling output terminal S3 and the input terminal IN1 of the amplifier 110 electrically isolated from the ground terminal GND. The fourth switching unit SW4 makes the first connection terminal N1 electrically isolated from the output terminal OUT of the amplifier 110. The fifth switching unit SW5 makes the second connection terminal N2 electrically coupled to the output terminal OUT of the amplifier 110.

As a result, in the level shifting period, the level-shifting capacitor array CLS charges the load capacitor CLD. Under such a condition, the load capacitor CLD makes the voltage of the signal output terminal SOUT further increase to accomplish a level-shifting mechanism so as to generate the output signal Vout at the signal output terminal SOUT.

In an embodiment, the relation between the output signal Vout and the input signal Vin can be expressed by the following equation:

$$V\text{out}=((CS1+CS2)/CS2)\times(1-((1\lambda)/(1+A_{21}\beta)(1+A_{22}\beta+\lambda)))V\text{in} \quad \text{(equation 1)}$$

The parameters CS1 and CS2 are respectively the capacitances of the first sampling capacitor CS1 and the second sampling capacitor CS2. The parameters $A_{21}$ and $A_{22}$ are the different amounts of the DC gain of the amplifier 110 respectively under a high swing operation and a low swing operation.

The parameter β is expressed by the following equation:

$$\beta=(CS2/(CS1+CS2)) \quad \text{(equation 2)}$$

The parameter λ is expressed by the following equation:

$$\lambda=CLD/CLS \quad \text{(equation 3)}$$

The parameter CLD is the capacitance of the load capacitor CLD, and the parameter CLS is the equivalent capacitance of the level-shifting capacitor array CLS.

In equation 1, the ratio between the output signal Vout and input signal Vin is the loop gain, which is the value of:

$$((CS1+CS2)/CS2)\times(1-((1+\lambda)/(1+A_{21}\beta)(1+A_{22}\beta+\lambda)))$$

As shown above, the loop gain includes a first term that is only related to the capacitances of the first sampling capacitor CS1 and the second sampling capacitor CS2 and a second term that is further related to the DC gain of the amplifier 110, the capacitance of the load capacitor CLD and the equivalent capacitance of the level-shifting capacitor array CLS.

As shown in the above equations, the DC gain of the amplifier 110 is related to the amount of the loop gain and the equivalent capacitance of the level-shifting capacitor array CLS. In some usage scenarios, the DC gain of the amplifier 110 may be affected by temperature, pressure or manufacturing process to have a variation of a dozen of decibels (dB). As a result, the control circuit 130 can determine the enabling combination of the level-shifting capacitors according to the DC gain to determine the equivalent capacitance of the level-shifting capacitor array CLS, to further determine the loop gain between the output signal Vout and input signal Vin.

In an embodiment, the control circuit 130 performs adjustment based on a gain analysis between the output terminal OUT of the amplifier 110 and the input terminal IN1.

In an embodiment, the control circuit 130 determines a variation of the DC gain according to a Fourier analysis between the output terminal OUT of the amplifier 110 and the input terminal IN1 to determine the enabling combination of the level-shifting capacitors. In an embodiment, the Fourier analysis is performed by feeding the input terminal IN1 having a sine wave and analyze the signal at the output terminal OUT.

It is appreciated that in some approaches, the configuration of the capacitor circuit in the switched capacitor amplifying apparatus makes the DC gain the larger the better. As a result, the control circuit 130 increases the equivalent capacitance (to decrease the parameter λ) when the DC gain decreases and decreases the equivalent capacitance (to increase the parameter λ) when the DC gain increases. However, in some approaches, the configuration of the capacitor circuit in the switched capacitor amplifying apparatus is different such that the optimal loop gain is obtained when the DC gain is at a certain optimal value instead of a larger value. Under such a condition, the control circuit 130 can adjust the equivalent capacitance according to a degree that the DC gain deviated from the optimal value based on the analysis.

Figure 3:
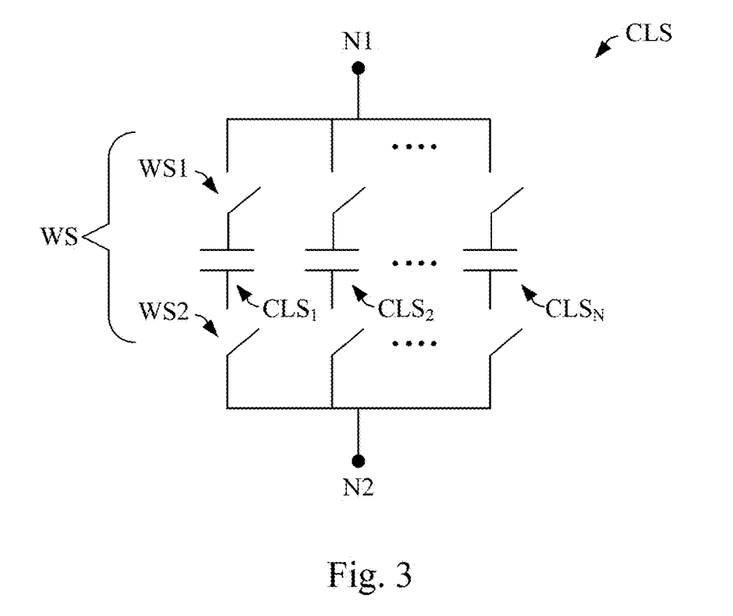
FIG. 3 illustrates a detailed circuit diagram of the level-shifting capacitor array according to an embodiment of the present invention.

Reference is now made to FIG. 3. FIG. 3 illustrates a detailed circuit diagram of the level-shifting capacitor array CLS according to an embodiment of the present invention.

As illustrated in FIG. 3, the level-shifting capacitor array CLS includes level-shifting capacitors $CLS_1$-$CLS_N$ and a plurality of switching circuits. Each of the switching circuits corresponds to one of the level-shifting capacitors $CLS_1$~$CLS_N$. In FIG. 3, only the switching circuit WS corresponding to the level-shifting capacitor $CLS_1$ is labeled.

In an embodiment, the switching circuit WS includes two switching units WS1 and WS2. The control circuit 130 controls the switching circuit WS to be enabled or disabled. When the switching circuit WS is enabled, the switching circuit WS makes the level-shifting capacitors CLS1 electrically coupled between the first connection terminal N1 and the second connection terminal N2 to serve as an enabled capacitor. When the switching circuit WS is disabled, the switching circuit WS makes the level-shifting capacitors CLS1 electrically isolated from the first connection terminal N1 and the second connection terminal N2 to serve as a disabled capacitor. As a result, when a multiple of the level-shifting capacitors CLS1~CLSN are enabled, the corresponding level-shifting capacitors are coupled in parallel. When the number of the enabled capacitors is larger, the equivalent capacitance of the level-shifting capacitor array CLS is larger. When the number of the enabled capacitors is lower, the equivalent capacitance of the level-shifting capacitor array CLS is smaller.

In an embodiment, the control circuit 130 can set the level-shifting capacitors CLS1~CLSN to have a certain number of capacitors enabled in a default condition. When the adjustment is required, the number of the enabled capacitors can be either increased or decreased to correspondingly increase and decrease the equivalent capacitance.

As a result, the switched capacitor amplifying apparatus 100 having gain adjustment mechanism disposes the level-shifting capacitor array CLS under the control of the control circuit 130 such that the equivalent capacitance of the level-shifting capacitor array CLS is adjusted according to the variation of the DC gain of the amplifier 110 to further adjust the loop gain by compensating the variation of the DC gain.

It is appreciated that the configuration of the switched capacitor amplifying apparatus 100 in FIGS. 2A-2C is merely an example. In different usage scenarios, the detailed configuration of the switched capacitor amplifying apparatus 100 can be implemented by other methods and is not limited by the configuration illustrated in FIGS. 2A-2C. Further, the configuration of the level-shifting capacitor array CLS can also be implemented differently according to practical requirements and is not limited to the configuration in FIG. 3.

Figure 4:
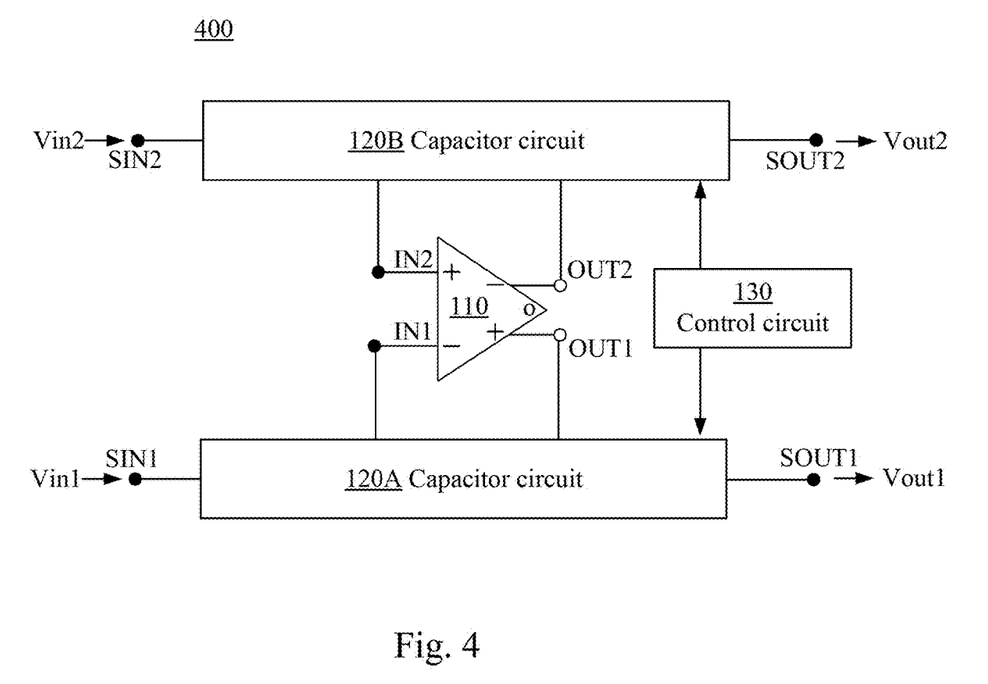
FIG. 4 illustrates a block diagram of a switched capacitor amplifying apparatus according to an embodiment of the present invention.

Reference is now made to FIG. 4. FIG. 4 illustrates a block diagram of a switched capacitor amplifying apparatus 400 according to an embodiment of the present invention.

The switched capacitor amplifying apparatus 100 in FIG. 1 is illustrated in a form of a single input terminal and a single output terminal However, as illustrated in the switched capacitor amplifying apparatus 400 in FIG. 4, the switched capacitor amplifying apparatus can be implemented in a form of dual input terminals and dual output terminals Under such a condition, the switched capacitor amplifying apparatus 400 still includes one amplifier 110. However, the amplifier 110 includes two input terminals, e.g., an input terminal IN1 and an input terminal IN2, and also includes two output terminals, e.g., an output terminal OUT1 and an output terminal OUT2. The input terminal IN1 and IN2 are respectively labeled by symbols '−' and '+'. The output terminal OUT1 and OUT2 IN2 are respectively labeled by symbols '+' and '−'.

On the other hand, the switched capacitor amplifying apparatus 400 includes two capacitors, which include the capacitor circuit 120A and the capacitor circuit 120B. The capacitor circuit 120A corresponds to the signal input terminal SIN1 and the signal output terminal SOUT1 and is coupled to the input terminal IN1 of the amplifier 110 and output terminal OUT1. The capacitor circuit 120B corresponds to the signal input terminal SIN2 and the signal output terminal SOUT2 and is coupled to the input terminal IN2 and the output terminal OUT2 of the amplifier 110. The configuration and operation of the capacitor circuits 120A and 120B are identical to those of the capacitor circuit 120 in FIG. 1. Only blocks are illustrated without showing the detailed configuration in FIG. 4 and no further description is made herein.

As a result, the capacitor circuit 120A is configured to receive the input signal Vin1 from the signal input terminal SIN1 and generate the output signal Vout1 at the signal output terminal SOUT1 based on the operation same as that of the capacitor circuit 120 in FIG. 1. The capacitor circuit 120B is configured to receive the input signal Vin2 from the signal input terminal SIN2 and generate the output signal Vout2 at the signal output terminal SOUT2 based on the operation same as that of the capacitor circuit 120 in FIG. 1.

The control circuit 130 can be configured to analyze the variation of the DC gain of the amplifier 110 according to the output signal Vout1, the output signal Vout2, the input signal Vin1 and the input signal Vin2 so as to adjust the enabling combination of the level-shifting capacitors in the level-shifting capacitor array of each of the capacitor circuits 120A and 120B (not illustrated in FIG. 4, however is similar to the level-shifting capacitor array CLS in FIGS. 2A-2C). The loop gain can thus be adjusted.

Figure 5:
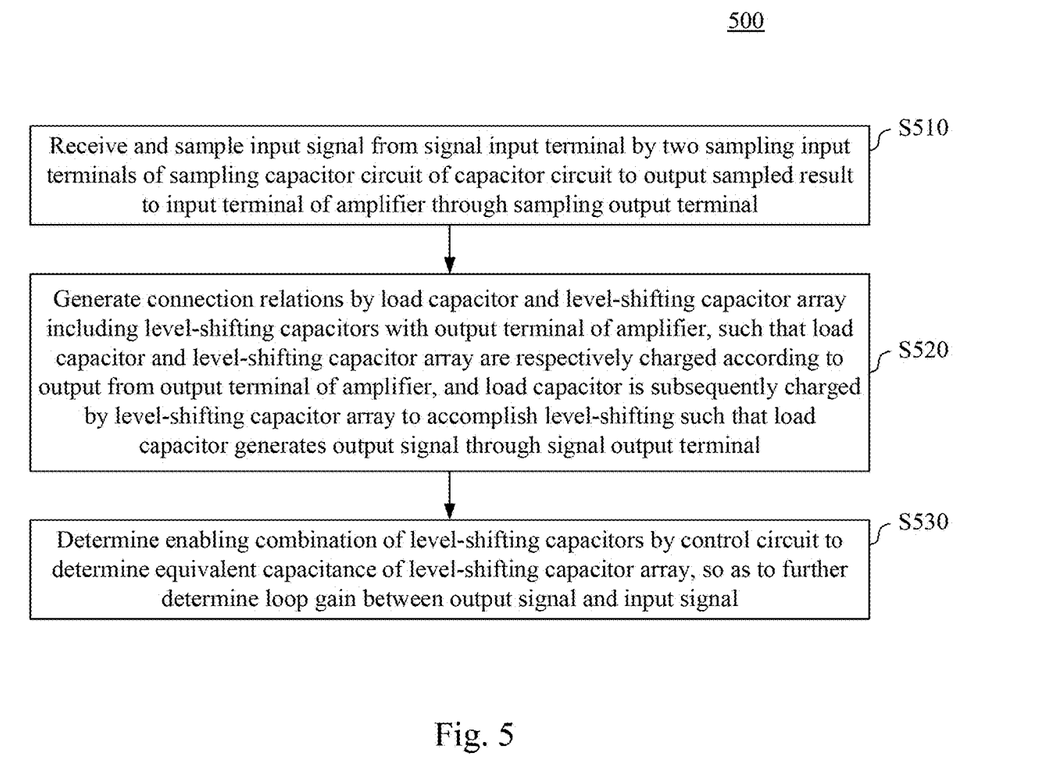
FIG. 5 illustrates a flow chart of a switched capacitor amplifying method 500 having gain adjustment mechanism according to an embodiment of the present invention.

Reference is now made to FIG. 5. FIG. 5 illustrates a flow chart of a switched capacitor amplifying method 500 having gain adjustment mechanism according to an embodiment of the present invention.

In addition to the apparatus described above, the present disclosure further provides the switched capacitor amplifying method 500 that can be used in such as, but not limited to, the switched capacitor amplifying apparatus 100 in FIG. 1. As illustrated in FIG. 5, an embodiment of the switched capacitor amplifying method 500 includes the following steps.

In step S510, the input signal Vin is received and sampled from the signal input terminal SIN by the two sampling input terminals S1 and S2 of the sampling capacitor circuit 140 of the capacitor circuit 120 to output the sampled result to the input terminal IN1 of the amplifier 110 through the sampling output terminal S3.

In step S520, the connection relations are generated by the load capacitor CLD and the level-shifting capacitor array CLS including the level-shifting capacitors CLS1~CLSN with the output terminal OUT of the amplifier 110, such that the load capacitor CLD and the level-shifting capacitor array CLS are respectively charged according to the output from the output terminal OUT of the amplifier 110, and the load capacitor CLD is subsequently charged by the level-shifting capacitor array CLS to accomplish level-shifting such that the load capacitor CLD generates the output signal Vout through the signal output terminal SOUT.

In step S530, the enabling combination of the level-shifting capacitors $CLS_1$~$CLS_N$ is determined by the control circuit 130 to determine the equivalent capacitance of the level-shifting capacitor array CLS, so as to further determine the loop gain between the output signal Vout and the input signal Vin.

It is appreciated that the embodiments described above are merely an example In other embodiments, it should be appreciated that many modifications and changes may be made by those of ordinary skill in the art without departing, from the spirit of the disclosure.

In summary, the present invention discloses the switched capacitor amplifying apparatus and the switched capacitor amplifying method having gain adjustment mechanism that disposes a level-shifting capacitor array under the control of a control circuit such that an equivalent capacitance of a level-shifting capacitor array is adjusted according to a variation of the DC gain of an amplifier to compensate a loop gain of an amplifier.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A switched capacitor amplifying apparatus having gain adjustment mechanism, comprising:
    an amplifier comprising an input terminal and an output terminal;
    a capacitor circuit corresponding to a signal input terminal and a signal output terminal and comprising:

a sampling capacitor circuit comprising two sampling input terminals and a sampling output terminal, wherein the two sampling input terminals receive and sample an input signal from the signal input terminal to further output a sampled result to the input terminal of the amplifier through the sampling output terminal;

a load capacitor; and a level-shifting capacitor array comprising a plurality of level-shifting capacitors; and a control circuit;

wherein the load capacitor and the level-shifting capacitor array generate a plurality of connection relations with the output terminal of the amplifier, such that the load capacitor and the level-shifting capacitor array are respectively charged according to an output from the output terminal of the amplifier, and the load capacitor is subsequently charged by the level-shifting capacitor array to accomplish level-shifting such that the load capacitor generates an output signal through the signal output terminal;

wherein the control circuit determines an enabling combination of the level-shifting capacitors to determine an equivalent capacitance of the level-shifting capacitor array, to further determine a loop gain between the output signal and the input signal;

wherein a DC gain of the amplifier is related to the amount of the loop gain and the equivalent capacitance of the level-shifting capacitor array, in which the control circuit determines a variation of the DC gain according to a Fourier analysis between the output terminal and the input terminal of the amplifier to further determine the enabling combination of the level-shifting capacitors according to the variation of the DC gain, and the control circuit increases the equivalent capacitance when the DC gain decreases and decreases the equivalent capacitance when the DC gain increases according to a gain analysis between the output terminal of the amplifier and the input terminal.

2. The switched capacitor amplifying apparatus of claim 1, wherein the load capacitor is electrically coupled between a first connection terminal and a ground terminal, and the level-shifting capacitor array is electrically coupled between the first connection terminal and a second connection terminal, wherein the first connection terminal is further electrically coupled to the signal output terminal;

in a sampling period, the first connection terminal is electrically coupled to the output terminal of the amplifier, the second connection terminal is grounded and the two sampling input terminals are only electrically coupled to the signal input terminal to receive and sample the input signal, and the sampling output terminal of the sampling capacitor circuit is electrically coupled to the input terminal of the amplifier and is grounded at the same time;

in an estimation period, the first connection terminal is electrically coupled to the output terminal of the amplifier, the second connection terminal is grounded, a first one of the two sampling input terminals of the sampling capacitor circuit is grounded, a second one of the two sampling input terminals of the sampling capacitor circuit is electrically coupled to the first connection terminal, and the sampling output terminal is electrically coupled to the input terminal of the amplifier without being grounded to feed the sampled input signal to the input terminal, such that the amplifier charges the load capacitor and the level-shifting capacitor array through the output terminal and the first connection terminal; and in a level shifting period, the first one of the two sampling input terminals of the sampling capacitor circuit is grounded, the second one of the two sampling input terminals of the sampling capacitor circuit is electrically coupled to the first connection terminal, the sampling output terminal is electrically coupled to the input terminal of the amplifier without being grounded, the first connection terminal is not electrically coupled to the output terminal of the amplifier and the second connection terminal is electrically coupled to the output terminal of the amplifier such that the level-shifting capacitor array charges the load capacitor.

3. The switched capacitor amplifying apparatus of claim 2, further comprising:

a first switching unit comprising a first terminal electrically coupled to the first one of the two sampling input terminals and a second terminal switched to be electrically coupled to the signal input terminal or the ground terminal;

a second switching unit comprising a third terminal electrically coupled to the second one of the two sampling input terminals and a fourth terminal switched to be electrically coupled to the signal input terminal or the first connection terminal;

a third switching unit comprising a fifth terminal electrically coupled to the sampling output terminal and the input terminal of the amplifier and a sixth terminal switched to be electrically coupled to the ground terminal or electrically isolated from the ground terminal;

a fourth switching unit comprising a seventh terminal electrically coupled to the first connection terminal and an eighth terminal switched to be electrically coupled to the output terminal of the amplifier or to be electrically isolated from the output terminal of the amplifier; and a fifth switching unit comprising a ninth terminal electrically coupled to the second connection terminal and a tenth terminal switched to be electrically coupled to the ground terminal or the output terminal of the amplifier.

4. The switched capacitor amplifying apparatus of claim 2, wherein the sampling capacitor circuit further comprises:

a first sampling capacitor electrically coupled between a first one of the two sampling input terminals and the sampling output terminal; and a second sampling capacitor electrically coupled between a second one of the two sampling input terminals and the sampling output terminal.

5. The switched capacitor amplifying apparatus of claim 1, wherein the level-shifting capacitor array further comprises a plurality of switching circuits to be controlled to be enabled or disabled by the control circuit, each the switching circuits corresponds to one of the level-shifting capacitors such that one of the switching circuits is enabled to keep one of the level-shifting capacitors electrically coupled between the first connection terminal and the second connection terminal to serve as an enabled capacitor, and is disabled to keep one of the level-shifting capacitors electrically isolated from the first connection terminal and the second connection terminal to serve as a disabled capacitor.

6. The switched capacitor amplifying apparatus of claim 1, wherein the input terminal of the amplifier is a first input terminal and the output terminal of the amplifier is a first output terminal, and the amplifier further includes a second input terminal and a second output terminal;

the capacitor circuit comprised by the switched capacitor amplifying apparatus is a first capacitor circuit, the corresponding signal input terminal is a first signal input terminal and the corresponding signal output terminal is a first signal output terminal;

the switched capacitor amplifying apparatus further comprises a second capacitor circuit having identical configuration with the first capacitor circuit and corresponds to the second input terminal, the second output terminal, a second signal input terminal and a second signal output terminal.

7. A switched capacitor amplifying method having gain adjustment mechanism used in a switched capacitor amplifying apparatus, comprising:

receiving and sampling an input signal from a signal input terminal by two sampling input terminals of a sampling capacitor circuit of a capacitor circuit to output a sampled result to an input terminal of an amplifier through a sampling output terminal;

generating a plurality of connection relations by a load capacitor and a level-shifting capacitor array comprising a plurality of level-shifting capacitors with the output terminal of the amplifier, such that the load capacitor and the level-shifting capacitor array are respectively charged according to an output from an output terminal of the amplifier, and the load capacitor is subsequently charged by the level-shifting capacitor array to accomplish level-shifting such that the load capacitor generates an output signal through the signal output terminal; and determining an enabling combination of the level-shifting capacitors by a control circuit to determine an equivalent capacitance of the level-shifting capacitor array, so as to further determine a loop gain between the output signal and the input signal, wherein a DC gain of the amplifier is related to the amount of the loop gain and the equivalent capacitance of the level-shifting capacitor array, the step of determining the enabling combination to determine the equivalent capacitance further comprises:

determining a variation of the DC gain according to a Fourier analysis between the output terminal and the input terminal of the amplifier to further determine the enabling combination of the level-shifting capacitors according to the variation of the DC gain by the control circuit; and increasing the equivalent capacitance when the DC gain decreases and decreasing the equivalent capacitance when the DC gain increases by the control circuit according to a gain analysis between the output terminal of the amplifier and the input terminal.

8. The switched capacitor amplifying method of claim 7, wherein the load capacitor is electrically coupled between a first connection terminal and a ground terminal, and the level-shifting capacitor array is electrically coupled between the first connection terminal and a second connection terminal, wherein the first connection terminal is further electrically coupled to the signal output terminal, the switched capacitor amplifying method further comprises:

in a sampling period, electrically coupling the first connection terminal to the output terminal of the amplifier, grounding the second connection terminal and electrically coupling the two sampling input terminals only to the signal input terminal to receive and sample the input signal, and electrically coupling the sampling output terminal of the sampling capacitor circuit to the input terminal of the amplifier and grounding the sampling output terminal at the same time;

in an estimation period, electrically coupling the first connection terminal to the output terminal of the amplifier, grounding the second connection terminal, grounding a first one of the two sampling input terminals of the sampling capacitor circuit, electrically coupling a second one of the two sampling input terminals of the sampling capacitor circuit to the first connection terminal, and electrically coupling the sampling output terminal to the input terminal of the amplifier without being grounded to feed the sampled input signal to the input terminal, such that the amplifier charges the load capacitor and the level-shifting capacitor array through the output terminal and the first connection terminal; and in a level shifting period, grounding the first one of the two sampling input terminals of the sampling capacitor circuit, electrically coupling the second one of the two sampling input terminals of the sampling capacitor circuit to the first connection terminal, electrically coupling the sampling output terminal to the input terminal of the amplifier without being grounded, not electrically coupling the first connection terminal to the output terminal of the amplifier and electrically coupling the second connection terminal to the output terminal of the amplifier such that the level-shifting capacitor array charges the load capacitor.

9. The switched capacitor amplifying method of claim 8, wherein the switched capacitor amplifying apparatus further comprises:

a first switching unit comprising a first terminal electrically coupled to the first one of the two sampling input terminals and a second terminal switched to be electrically coupled to the signal input terminal or the ground terminal;

a second switching unit comprising a third terminal electrically coupled to the second one of the two sampling input terminals and a fourth terminal switched to be electrically coupled to the signal input terminal or the first connection terminal;

a third switching unit comprising a fifth terminal electrically coupled to the sampling output terminal and the input terminal of the amplifier and a sixth terminal switched to be electrically coupled to the ground terminal or electrically isolated from the ground terminal;

a fourth switching unit comprising a seventh terminal electrically coupled to the first connection terminal and an eighth terminal switched to be electrically coupled to the output terminal of the amplifier or to be electrically isolated from the output terminal of the amplifier; and a fifth switching unit comprising a ninth terminal electrically coupled to the second connection terminal and a tenth terminal switched to be electrically coupled to the ground terminal or the output terminal of the amplifier.

10. The switched capacitor amplifying method of claim 8, wherein the sampling capacitor circuit further comprises:

a first sampling capacitor electrically coupled between a first one of the two sampling input terminals and the sampling output terminal; and a second sampling capacitor electrically coupled between a second one of the two sampling input terminals and the sampling output terminal.

11. The switched capacitor amplifying method of claim 7, wherein the level-shifting capacitor array further comprises a plurality of switching circuits to be controlled to be enabled or disabled by the control circuit, each the switching circuits corresponds to one of the level-shifting capacitors, the switched capacitor amplifying method further comprises:

enabling one of the switching circuits to keep one of the level-shifting capacitors electrically coupled between the first connection terminal and the second connection terminal to serve as an enabled capacitor; and     disabling one of the switching circuits to keep one of the level-shifting capacitors electrically isolated from the first connection terminal and the second connection terminal to serve as a disabled capacitor.

12. The switched capacitor amplifying method of claim 7, wherein the input terminal of the amplifier is a first input terminal and the output terminal of the amplifier is a first output terminal, and the amplifier further includes a second input terminal and a second output terminal;

the capacitor circuit comprised by the switched capacitor amplifying apparatus is a first capacitor circuit, the corresponding signal input terminal is a first signal input terminal and the corresponding signal output terminal is a first signal output terminal;

the switched capacitor amplifying apparatus further comprises a second capacitor circuit having identical configuration with the first capacitor circuit and corresponds to the second input terminal, the second output terminal, a second signal input terminal and a second signal output terminal.

\* \* \* \* \*